United States Patent [19]
Proulx

[11] Patent Number: 5,304,741
[45] Date of Patent: Apr. 19, 1994

[54] SPEAKER CABLE
[75] Inventor: Robert A. Proulx, Natick, Mass.
[73] Assignee: Temp-Flex Cable, Inc., S. Grafton, Mass.
[21] Appl. No.: 927,467
[22] Filed: Aug. 10, 1992
[51] Int. Cl.⁵ ............................................. H01B 7/08
[52] U.S. Cl. ........................ 174/117 FF; 174/74 R; 174/110 FC; 174/112
[58] Field of Search .......... 174/117 FF, 112, 110 FL, 174/74 R

[56] References Cited

U.S. PATENT DOCUMENTS

| | | | |
|---|---|---|---|
| 2,338,524 | 1/1944 | McCabe | 174/74 R |
| 2,483,424 | 10/1949 | Martines | 174/74 R |
| 2,888,511 | 5/1959 | Guritz | 174/117 FF |
| 3,439,111 | 4/1969 | Miracle et al. | 174/117 FF |
| 4,382,236 | 5/1983 | Suzuki | 174/117 FF X |
| 4,578,529 | 3/1986 | Look | 174/117 FF |
| 5,025,115 | 6/1991 | Sayegh et al. | 174/117 FF X |
| 5,049,215 | 9/1991 | Strauss | 174/117 FF X |
| 5,091,610 | 2/1992 | Strauss | 174/117 F |
| 5,105,055 | 4/1992 | Mooney et al. | 174/117 FF X |
| 5,180,890 | 1/1993 | Pendergrass et al. | 174/117 F |

Primary Examiner—Morris H. Nimmo
Attorney, Agent, or Firm—Samuels, Gauthier & Stevens

[57] ABSTRACT

A ribbon connector for use in an audio system as a speaker cable. The ribbon connector comprises two sets of flat conductors encapsulated in fluorinated ethylene polypropylene. Each of the sets is spaced apart from one another by a median strip of insulation. The median strip has a width greater than the thickness of the insulation between adjacent conductors in a set. This allows the sets to be separated from one another when a terminal is placed on each set. The conductors of a set function as a single conductor in that when used they are joined to a single terminal. The ribbon connector has enhanced capacitance and inductance characteristics compared to round twisted wire conductors.

4 Claims, 2 Drawing Sheets

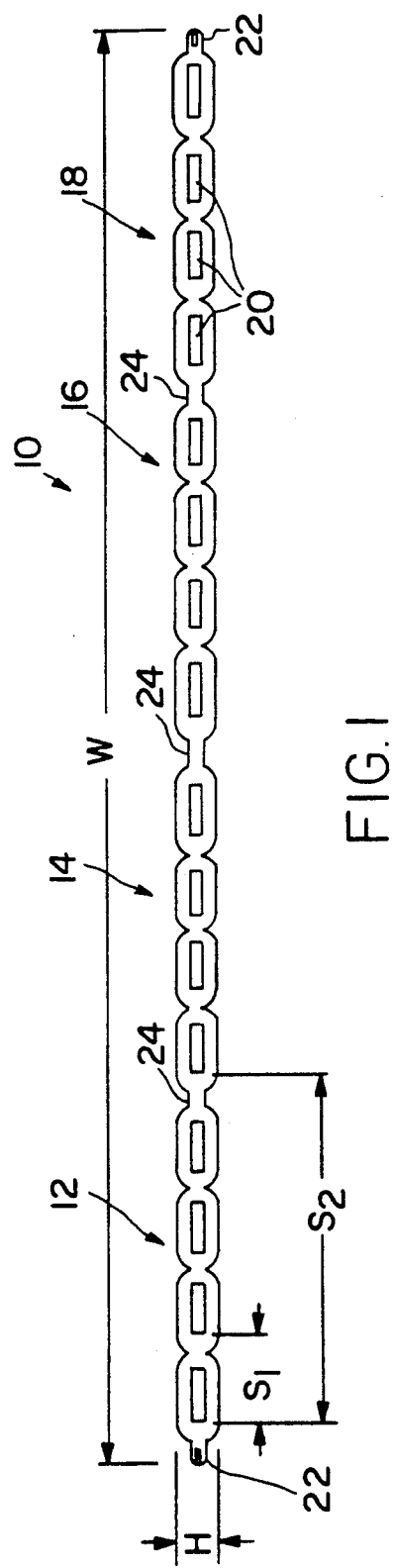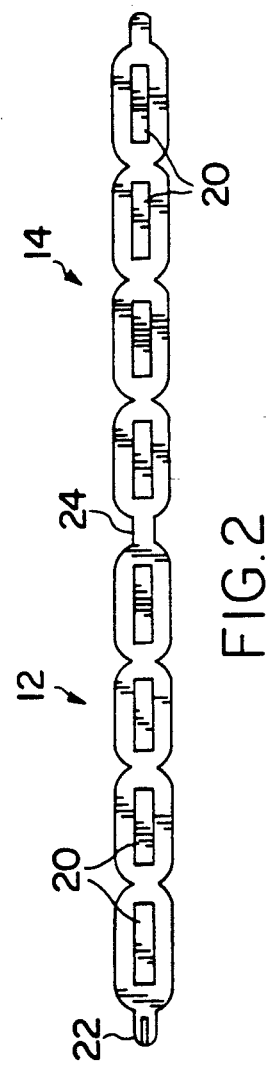

SPEAKER CABLE

BACKGROUND AND BRIEF SUMMARY OF THE INVENTION

Ribbon cables are a standard component in computer hardware. A series of conductors, which conductors may be flat, round and/or a combination of both, are extruded or laminated with a polymeric material as an integral piece with the conductors and ground wires encapsulated in the polymer. The polymer or insulation maintain the conductors in parallel spaced apart relationship. The ribbon conductors are designed to minimize cross talk, to control impedance within predetermined limits and to maximize signal speed. In ribbon cables, the number of signal lines can range anywhere from 9 to 64 with each line having a ground line on either side resulting in a configuration of a ground line, a signal line, two ground lines, a signal line, two ground lines, etc. Before a ribbon cable is secured to a connector, the ends are stripped, the ground lines are deflected in one direction, either upwardly or downwardly, and connected to a common buss and the signal lines are deflected in the other direction, either upwardly or downwardly, and connected to the desired pins in the connector.

The present invention is directed to a ribbon connector which is structured and functions as a one- or two-paired speaker cable.

Current speaker cables comprise a pair of insulated round conductors having terminals at their ends, which terminals are connected to audio components in a sound equipment system.

Broadly the invention is a ribbon connector which comprises two sets of flat conductors encapsulated in a polymeric material (insulation) and in the preferred embodiment, encapsulated in clear fluorinated ethylene propylene (FEP). Each of the sets is spaced apart from one another by a medium strip of insulation. This medium strip has a width greater than the thickness of the insulation between adjacent conductors in a set. This allows the sets to be separated from one another when a terminal is placed on each set, i.e. the first set is physically separated from the second set, without exposing the conductors and/or affecting the electrical characteristics of the cable. At least one side of the cable is characterized by a polarity stripe. The conductors of a set function as a single conductor in that when used they are joined to a single terminal.

In the preferred embodiment of the invention, the conductors are copper and the FEP is clear and a polarity stripe of a color distinct from the FEP and copper conductors is used. This provides an aesthetically attractive ribbon cable which can function as a decorative feature of a sound system. Alternatively, because of its flatness, the cable is easily placed under a rug or may lay flat against a wall. Surprisingly, because of the design of the speaker cable, it has a much better current carrying capacity than prior round paired conductors. In the preferred embodiment, with a four conductor configuration for each set, the amount of copper used for the four conductors is that which would be required for a round, single conductor of 16 gauge. However, because of the geometry of the four flat conductors, the set of conductors has the current carrying capacity of a 12 gauge round conductor. In addition to reducing the material requirements for this current carrying capacity, the configuration also has superior capacitance and inductance characteristics.

BRIEF DESCRIPTION OF THE DRAWINGS

FIG. 1 is an end view of a two-paired ribbon cable;
FIG. 2 is an end view of a one-paired cable.

DESCRIPTION OF THE PREFERRED EMBODIMENT(S)

Figure 3:
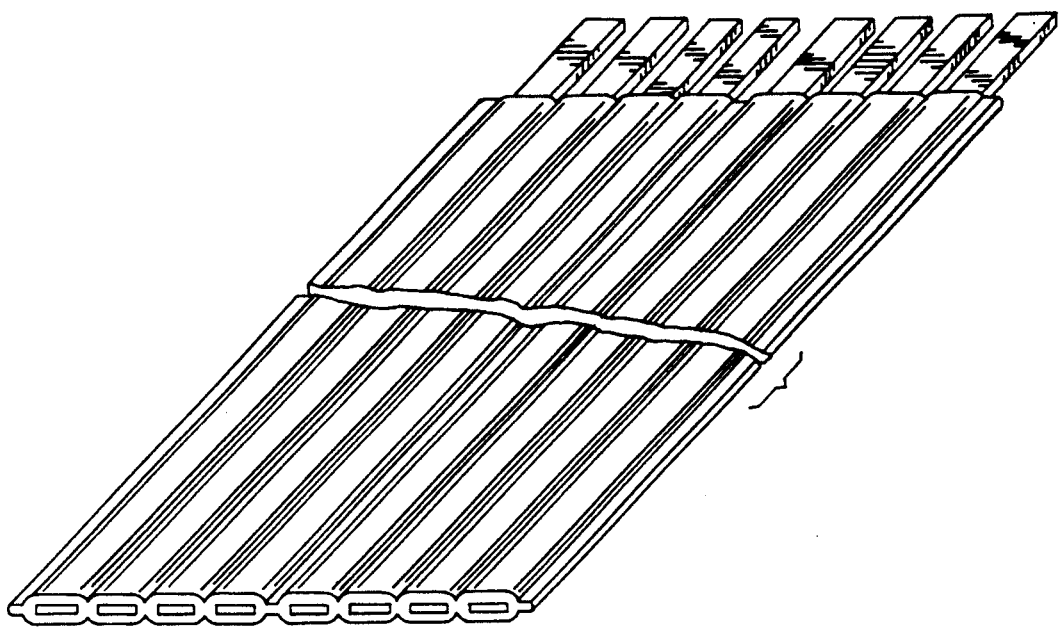
FIG. 3 is a perspective view of the cable of FIG. 1.

When an insulating material is used between conductors carrying an electrical signal it acts as a capacitor. That is, it stores energy and later releases it. This energy release can induce phase distortions into the signal. Keeping capacitance or energy storage to the minimum is essential to reduce phase distortions in the signal. All insulators increase their capacitance as the signal frequency increases, but some insulators are more uniform than others. In making comparisons between speaker cable insulation materials polyvinylchloride (PVC) is the most common and least expensive insulator, however, its insulation properties are very frequency dependent. This means that PVC will always result in the highest capacitance for a given cable construction. Polyethylene is a slightly better insulator than PVC and polypropylene is better still, however, both share PVC's poor flammability. Polypropylene also suffers from limited flexibility, limiting its use for certain applications. FEP is by far the best insulator currently available. It is essentially uniform in its electrical characteristics at all frequencies up to 1 GHz. Using FEP lowers the capacitance thus keeping signal distortions to a minimum.

Due to the unique design and cable geometry of the cable, there are measurable and audible sonic benefits, when it is used as an interconnect between an amplifier and loudspeaker system.

The cable has a lower dielectric constant than any other speaker cable currently available due to the use of FEP insulation. The cable is the closest wire design to the ideal conductor which is a bare wire suspended in air as shown by the following measurements:

| DIELECTRIC CONSTANT | | |
|---|---|---|
| PVC | FEP | AIR |
| 3.0 to 5.0 | 2.01 | 1.0 |

FEP being lower than PVC results in very low phase distortions and reduced capacitance.

The cable has far more current carrying capacity than equivalent round conductors. This is due to the increased surface area of flat conductors, which maximizes heat dissipation. The cable in effect runs cooler, molecular vibration of the conductors is reduced, giving it the ability to carry the same current as a physically larger round conductor.

Skin effect is the tendency for electrical signals to travel on the outer surface of the wire. Skin effect is usually associated with amplitude attenuation (power loss) at high frequencies, at audio frequencies this effect is diminished. However, flat conductors significantly reduce audible distortions caused by skin effect.

At audio frequencies within a speaker cable, skin effect causes changes in inductance and resistance. The audio signal will penetrate to different depths within the conductor at different frequencies due to changing electrical values. This effect is most noticeable at high frequencies, and can result in an audible smearing, causing the sound to lack clarity and seem lifeless. If significant enough, listening fatigue will ensure. By using multiple, flat, separately insulated conductors, skin effect distortion is nearly eliminated. The greater surface area of rectangular flat conductors lowers these distortions much more than an equivalent round conductor.

Another problem which is eliminated with the cable construction is strand interaction. Because the cable uses solid flat rectangular conductors individually encapsulated in insulation, current flow is not impeded, and it does not have to jump strands as it progresses down the cable. The flat configuration of the wire also significantly lowers inductance. The following test results show this clearly.

|  | CAPACITANCE | INDUCTANCE | IMPEDANCE |
|---|---|---|---|
| Cable[1] | 6.0 pF/ft | .09 uH/ft | 120 ohm |
| Original Monster[2] Cable | 22.2 pF/ft | .16 uH/ft | 100 ohm |
| Monster Cable Hot Wires 2 + 2 | 12.0 pF/ft | .17 uH/ft | 120 ohm |

[1]Specifications described in the preferred embodiment
[2](Need Manufacturer and Location)

This test shows that the cable has a much lower inductance and capacitance than conventional cables. Lower inductance allows the cable to react more quickly to current changes. This is essential if a speaker system is to be driven to its full potential. Parallel flat conductors have lower inductance than conventional round conductors, therefore current flows more freely. This results in a signal which reproduces every nuance of the music.

A number of independently conducted listening tests have verified the enhanced quality of the sound with the cable of the invention. The music is more defined, the bass clearer and powerful and the timbre of instruments was more like life. All listeners reported that listening fatigue was diminished and that imaging and soundstaging seemed to be improved.

A preferred cable 10 of the invention is shown in reference to FIG. 1 with four sets of conductors 12, 14, 16 and 18, each having four conductors 20, all conductors encapsulated in FEP insulation. The cable can be manufactured either using lamination or extrusion processes. Extrusion processes are preferred and extrusion of FEP ribbon cable is well known in the art.

The cable is typically extruded as two pairs, as shown in FIG. 1, and then slit to form a one-pair ribbon cable shown in FIG. 2. When extruded, polarity stripes 22, such as FEP monofiliment, are formed in the outer edges. Between each set of four conductors is a medium strip 24. The strip 24 between the sets 14 and 16 is sliced to form two one-pair conductors, one of which is shown in FIG. 2. The width, W, is 1.240 inches; the height, H, is 0.02 inches; the distance, $S_1$, between edges of adjacent conductors is 0.070 inches, and the distance, $S_2$, is 0.320 inches between the edges of conductors of the first and second sets. The conductors are 0.010×0.050 bare copper, resulting in a D.C. resistance of 16.2 ohms/1,000 ft. at 20° C., a temperature rating −65° C. to 150° C., a voltage rating of 300 V and a current rating of 6 amp/conductor. The insulation is fluorinated ethylene propylene.

Referring to FIG. 2, an end view of a one-pair ribbon cable of FIG. 1 is shown and comprises the clear insulating material 14, the copper conductors 16 and the polarity stripe 22 of a color distinct from the copper and clear insulating material, such as red.

Referring to FIG. 3, the conductor is shown with the insulation strip from one end thereof.

Figure 4:
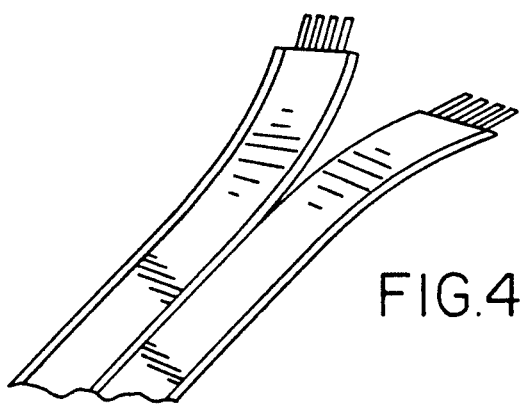
FIG. 4 is a perspective view of the cable of FIG. 3.

Referring to FIG. 4, the paired conductors are separated into a pair of leads.

Figure 5:
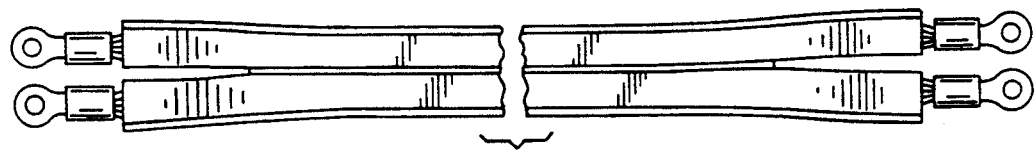
FIG. 5 is a perspective view of the cable of FIG. 4 with ring tongue terminals being secured thereto.

Referring to FIG. 5, hole tongue terminals 20 are secured to the exposed conductors, which conductors are joined or crimped together, thus completing the cable assembly.

The foregoing description has been limited to a specific embodiment of the invention. It will be apparent, however, that variations and modifications can be made to the invention, with the attainment of some or all of the advantages of the invention. Therefore, it is the object of the appended claims to cove all such variations and modifications as come within the true spirit and scope of the invention.

Having described my invention, what I now claim is:

1. A ribbon connector for loud speaker systems which comprises:
    a first set of flat conductors arrayed in parallel spaced apart relationship and encapsulated in fluorinated ethylene polypropylene;
    a second set of flat conductors arrayed in parallel relationship, one to the other, the conductors of second set parallel to the conductors of the first set, said second set encapsulated in fluorinated ethylene polypropylene, a medium strip integrally formed between said first and second sets said first and second sets spaced apart by a width greater than the width between adjacent conductors in a set such that the first set of conductors may be separated from the second set of conductors to form first and second conductive sets electrically isolated from one another, said connector having a capacitance of 6.0 pF/ft. or less, an inductance of 0.09 μH/ft.

2. The connector of claim 1 wherein one of the sets includes a distinctly visual line to establish polarity.

3. The connector of claim 1 which comprises a pair of leads at each end of the connector, the leads comprising exposed conductors.

4. The connector of claim 3 wherein the exposed conductors of the leads of each are joined together and secured to terminals.

* * * * *